(12) United States Patent
Palaniswamy et al.

(10) Patent No.: US 9,236,547 B2
(45) Date of Patent: Jan. 12, 2016

(54) TWO PART FLEXIBLE LIGHT EMITTING SEMICONDUCTOR DEVICE

(75) Inventors: Ravi Palaniswamy, Singapore (SG); Alejandro Aldrin Il Agcaoili Narag, Singapore (SG); Jian Xia Gao, Singapore (SG); Justine A. Mooney, Austin, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/233,266

(22) PCT Filed: Aug. 8, 2012

(86) PCT No.: PCT/US2012/049889
§ 371 (c)(1),
(2), (4) Date: Jan. 16, 2014

(87) PCT Pub. No.: WO2013/025402
PCT Pub. Date: Feb. 21, 2013

(65) Prior Publication Data
US 2014/0153263 A1  Jun. 5, 2014

Related U.S. Application Data

(60) Provisional application No. 61/524,646, filed on Aug. 17, 2011, provisional application No. 61/665,780, filed on Jun. 28, 2012.

(51) Int. Cl.
*H01L 33/62* (2010.01)
*F21V 29/00* (2015.01)
(Continued)

(52) U.S. Cl.
CPC .............. *H01L 33/62* (2013.01); *F21V 29/20* (2013.01); *H01L 33/486* (2013.01); *H01L 33/64* (2013.01);
(Continued)

(58) Field of Classification Search
CPC ...... H01L 33/48; H01L 33/483; H01L 33/486; H01L 33/62; H01L 33/64; H01L 33/642; H01L 33/644; H01L 33/647
USPC ...................................................... 257/79–100
See application file for complete search history.

(56) References Cited

U.S. PATENT DOCUMENTS

| 4,994,938 A | 2/1991 | Baudouin |
| 6,153,928 A | 11/2000 | Cho |

(Continued)

FOREIGN PATENT DOCUMENTS

| CN | 1825640 | 8/2006 |
| EP | 0338641 | 10/1989 |

(Continued)

OTHER PUBLICATIONS

International Search Report for PCT International Application No. PCT/US2012/049889 Mailed on Feb. 27, 2013, 3 pages.

*Primary Examiner* — Whitney T Moore
*Assistant Examiner* — Scott Stowe
(74) *Attorney, Agent, or Firm* — Clifton F. Richardson

(57) ABSTRACT

Provided is a light emitting semiconductor device comprising a flexible dielectric layer, a conductive layer on at least one side of the dielectric layer, at least one cavity or via in the dielectric substrate, and a light emitting semiconductor supported by the cavity or via. Also provided is a support article comprising a flexible dielectric layer, a conductive layer on at least one side and at least one cavity or via in the dielectric substrate. Further provided is a flexible light emitting semiconductor device system comprising the above-described light emitting semiconductor device attached to the above-described support article.

6 Claims, 11 Drawing Sheets

(51) Int. Cl.
   *H01L 33/64* (2010.01)
   *H01S 5/022* (2006.01)
   *H01S 5/024* (2006.01)
   *H01L 33/48* (2010.01)

(52) U.S. Cl.
   CPC .......... *H01L 2224/48227* (2013.01); *H01L 2224/73265* (2013.01); *H01L 2924/01322* (2013.01); *H01L 2924/12032* (2013.01); *H01S 5/02276* (2013.01); *H01S 5/02469* (2013.01)

(56) References Cited

U.S. PATENT DOCUMENTS

| | | |
|---|---|---|
| 6,320,753 B1 | 11/2001 | Launay |
| 6,331,063 B1 | 12/2001 | Kamada et al. |
| 6,412,971 B1 | 7/2002 | Wojnarowski |
| 6,531,328 B1 | 3/2003 | Chen |
| 7,296,916 B2 | 11/2007 | Ouderkirk |
| 7,626,208 B2 | 12/2009 | Yang |
| 7,714,341 B2 | 5/2010 | Chil Keun |
| 7,800,121 B2 | 9/2010 | Aanegola et al. |
| 7,806,560 B2 | 10/2010 | Schultz |
| 7,871,836 B2 | 1/2011 | Yang |
| 8,101,966 B2 | 1/2012 | Yen |
| 8,384,121 B2 | 2/2013 | Tischler et al. |
| 2002/0163006 A1 | 11/2002 | Yoganandan |
| 2005/0247944 A1 | 11/2005 | Haque |
| 2006/0018120 A1 | 1/2006 | Linehan |
| 2006/0171152 A1 | 8/2006 | Suehiro |
| 2007/0007558 A1 | 1/2007 | Mazzochette |
| 2007/0029569 A1 | 2/2007 | Andrews |
| 2007/0096272 A1 | 5/2007 | Wang |
| 2007/0120089 A1 | 5/2007 | Mao |
| 2007/0253209 A1 | 11/2007 | Loh et al. |
| 2008/0057333 A1 | 3/2008 | Chu et al. |
| 2008/0067526 A1 | 3/2008 | Chew |
| 2008/0101071 A1 | 5/2008 | Imai |
| 2008/0315239 A1 | 12/2008 | Lin |
| 2009/0014749 A1* | 1/2009 | Matsuda .................. 257/99 |
| 2009/0121249 A1 | 5/2009 | Tseng et al. |
| 2009/0201699 A1 | 8/2009 | Ohno |
| 2009/0273925 A1 | 11/2009 | Schultz |
| 2009/0311810 A1 | 12/2009 | Yang |
| 2010/0155696 A1 | 6/2010 | Duan |
| 2010/0165601 A1 | 7/2010 | Yoon |
| 2011/0031509 A1 | 2/2011 | Kirihara |
| 2012/0002420 A1 | 1/2012 | Imai |

FOREIGN PATENT DOCUMENTS

| | | |
|---|---|---|
| EP | 1744376 | 1/2007 |
| JP | 2003-209141 | 7/2003 |
| KR | 2009-0002205 | 1/2009 |
| WO | WO 2012-061010 | 5/2012 |
| WO | WO 2012-061182 | 5/2012 |
| WO | WO 2012-061183 | 5/2012 |
| WO | WO 2012-061184 | 5/2012 |
| WO | WO 2012-112310 | 8/2012 |
| WO | WO 2012-112666 | 8/2012 |
| WO | WO 2012-112873 | 8/2012 |
| WO | WO 2013-025402 | 2/2013 |

* cited by examiner

TWO PART FLEXIBLE LIGHT EMITTING SEMICONDUCTOR DEVICE

CROSS REFERENCE TO RELATED APPLICATIONS

This application is a national stage filing under 35 U.S.C. 371 of PCT/US2012/049889, filed Aug. 8, 2012, which claims priority to Provisional Application No. 61/524,646, filed Aug. 17, 2011, and Provisional Application No. 61/665,780, filed Jun. 28, 2012, the disclosures of which is incorporated by reference in its/their entirety herein.

TECHNICAL FIELD

This invention relates to flexible high power light emitting semiconductor devices.

BACKGROUND

Conventional light emitting semi-conductor (LES), including light emitting diodes (LEDs) and laser diodes, and LES devices (LESD) and packages containing LESDs have several drawbacks. High power LESDs generate a substantial amount of heat that must be managed. Thermal management deals with problems arising from heat dissipation and thermal stresses, which is currently a key factor in limiting the performances of light-emitting diodes.

In general, LES devices are commonly prone to damage caused by buildup of heat generated from within the devices, as well as heat from sunlight in the case of outside lighting applications. Excessive heat buildup can cause deterioration of the materials used in the LES devices, such as encapsulants for the LESDs. When LESDs are attached to flexible-circuit laminates, which may also include other electrical components, the heat dissipation problems are greatly increased.

When LESDs are packaged into sub-mount devices, which are then attached to secondary driver systems such as metal core PCB (MPCB), metal insulated substrate (MIS), Bergquist thermal boards, COOLAM substrates, etc., the thermal performance of the submount depends on the thermal resistance of each element in the structure including the submount device, the secondary driver, and the heat sink. In many cases, the secondary driver limits the thermal performance of sub-mount device. Consequently, there is a continuing need to improve the design of support articles and packages to improve their thermal dissipation properties.

SUMMARY

At least one aspect of the present invention provides a cost-effective thermal management solution for current and future high power LESD constructions through a robust flexible LESD construction. The ability to dissipate large amounts of heat is needed for the operation of high power LESD arrays. According to at least one embodiment of the present invention, heat dissipation can be managed by integrating the LESDs into a system having a flexible dielectric layer that employs a via or cavity to accomplish better heat management. In at least some embodiment of the present invention, to create the vias or cavities, etching through (for vias) or into (for cavities) the dielectric layer is performed.

At least one embodiment of the present invention provides a light emitting semiconductor device Z comprising a flexible dielectric layer having a first major surface with a first conductive layer thereon and having a second major surface with a second conductive layer thereon, the dielectric layer having one or both of a first and second via extending through the dielectric layer and a cavity or a third via extending from the first surface to, or toward, the second surface of the dielectric layer, the first conductive layer comprising conductive features in electrical contact with one or both of the first and second vias, the cavity or third via at least partially filled with conductive material the second conductive layer comprising conductive features in electrical contact with one or both of the first and second vias; the cavity, or third via, being configured to receive a light emitting semiconductor. In at least one embodiment, one or both of the first and second vias may be hollow plated vias. In at least one embodiment, the second conductive layer may further comprise a conductive feature aligned with the third via or cavity. In at least one embodiment, the conductive features of the second layer may extend under at least a portion of the third via or cavity and are electrically isolated from each other.

At least on embodiment of the present invention provides a support article Y comprising a flexible dielectric layer having a first major surface and having a second major surface with a conductive layer thereon, the dielectric layer having at least two adjacent cavities or vias extending from the first major surface toward, or to, the second major surface, the two or more cavities or vias each configured to receive one or more bottom contacts of an LES package mounted on the support article, wherein contacts received by a single cavity or via have the same, or a neutral, polarity. In at least one embodiment, the conductive layer on the second major surface of the dielectric layer comprises a conductive feature disposed beneath each via. In at least one embodiment, the first major surface of the dielectric layer has a conductive layer thereon. In at least one embodiment, the conductive layer on the first major surface of the dielectric layer extends into the cavities or vias. In at least one embodiment, the cavities or vias contain conductive material.

At least on embodiment of the present invention provides a flexible LESD system X comprising an embodiment of light emitting semiconductor device Z and an embodiment of support article Y wherein the conductive features of the second conductive layer of the light emitting semiconductor device make one or both of electrical and thermal connections in the cavities or vias of the support article.

At least on embodiment of the present invention provides a flexible LESD system V comprising an embodiment of light emitting semiconductor device Z and an embodiment of a support article comprising a flexible dielectric layer having a first major surface with a first conductive layer thereon and having a second major surface, the dielectric layer having at least one cavity, or via, extending from the second major surface toward, or to, the first major surface, the at least one cavity, or via, containing conductive material, the first conductive layer comprising a first conductive feature disposed atop the cavity, or via, and at least one second conductive feature disposed adjacent the first conductive feature. In at least one embodiment, a cavity, or via, containing conductive material is disposed under the at least one second conductive feature of the support article. In at least one embodiment, the second major surface of the flexible dielectric layer of the support article has a second conductive layer thereon.

At least on embodiment of the present invention provides a flexible LESD system U comprising an embodiment of light emitting semiconductor Z and an embodiment of a support article comprising a flexible dielectric layer having a first major surface with a first conductive layer thereon and having a second major surface with a second conductive layer thereon, the dielectric layer having at least one cavity or via extending from the first major surface toward, or to, the second major surface and containing conductive material that form at least two electrically isolated conductive features. In at least one embodiment, one or both conductive features of the light emitting semiconductor device comprises a protrusion and at least one of the electrically isolated features comprises an indentation configured to receive the protrusion of the light emitting semiconductor device.

Additional embodiments of the present invention are described in the following paragraphs.

Embodiment A

At least one aspect of the present invention provides a light emitting semiconductor device comprising a flexible dielectric layer having a first major surface with a first conductive layer thereon and having a second major surface with a second conductive layer thereon, the dielectric layer having two vias extending through the dielectric layer and a third via, or a cavity, extending from the first surface to, or toward, the second surface of the dielectric layer, the first conductive layer comprising conductive pads in electrical contact with each of the two vias, the first conductive layer further extending into the third via, or cavity, the second conductive layer comprising conductive pads in electrical contact with each of the two vias and optionally a conductive feature aligned with the via opening in the second surface, or with the cavity floor; the cavity, or via, being optionally filled with conductive material; and a light emitting semiconductor in the via, or cavity. All or a portion of the two vias may comprise hollow plated vias. The third via or cavity may contain conductive material in addition to the conductive material comprising the conductive layer that extends into the third via or cavity.

Embodiment B

At least one aspect of the present invention provides a support article comprising a flexible dielectric layer having a first major surface with a first conductive layer thereon and having a second major surface, the dielectric layer having at least one cavity, or via, extending from the second major surface toward, or to, the first major surface, the at least one cavity, or via, containing conductive material, the first conductive layer comprising a conductive feature disposed atop the cavity, or via, and conductive pads disposed adjacent the conductive feature.

Embodiment C

At least one aspect of the present invention provides a support article comprising a flexible dielectric layer having a first major surface with a first conductive layer thereon and having a second major surface, the dielectric layer having three cavities, or vias, extending from the second major surface toward, or to, the first major surface, the three cavities, or vias, containing conductive material, the first conductive layer comprising a conductive feature disposed atop one cavity, or via, and conductive pads disposed adjacent the conductive feature and atop the other two cavities, or vias.

Embodiment D

At least one aspect of the present invention provides a support article comprising a flexible dielectric layer having a first major surface with a first conductive layer thereon and having a second major surface, the dielectric layer having two cavities, or vias, extending from the second major surface toward, or to, the first major surface, the two cavities, or vias, containing conductive material, the first conductive layer comprising a conductive pads disposed atop each cavity, or via.

Embodiment E

At least one aspect of the present invention provides a support article comprising a flexible dielectric layer having a first major surface with a first conductive layer thereon and having a second major surface, the dielectric layer having one cavity and one via, extending from the second major surface toward, or to, the first major surface, the cavity and via containing conductive material, the first conductive layer comprising a conductive pads disposed atop each of the cavity and the via.

Embodiment F

At least one aspect of the present invention provides a support article comprising a flexible dielectric layer having a first major surface with a first conductive layer thereon and having a second major surface, the dielectric layer having one cavity, or via, extending from the second major surface toward, or to, the first major surface, the cavity, or via, containing conductive material, the first conductive layer comprising two conductive pads, one of which is disposed atop the cavity, or via.

Embodiment G

At least one aspect of the present invention provides a support article comprising a flexible dielectric layer having a first major surface with a first conductive layer thereon and having a second major surface with a second conductive layer thereon, the dielectric layer having two cavities, or vias, extending from the first major surface toward, or to, the second major surface; the first conductive layer extending into the two cavities, or vias; and the two cavities, or vias, optionally containing additional conductive material.

Embodiment H

At least one aspect of the present invention provides a support article comprising a flexible dielectric layer having a first major surface with a first conductive layer thereon and having a second major surface with a second conductive layer thereon, the dielectric layer having two cavities, or vias, extending from the second major surface toward, or to, the first major surface; the second conductive layer extending into the two cavities, or vias; the two cavities, or vias, optionally containing additional conductive material; and the first conductive layer comprising a conductive pad disposed atop each of the cavities, or vias.

Embodiment I

At least one aspect of the present invention provides a support article comprising a flexible dielectric layer having a first major surface with a first conductive layer thereon and having a second major surface with a second conductive layer thereon, the dielectric layer having at least one cavity, or via, extending from the first major surface toward, or to, the second major surface; the first conductive layer extending into the at least one cavity, or via; and the at least one cavity, or via, containing a conductive feature and two conductive pads, the conductive pads electrically insulated from each other and from the conductive feature.

Embodiment J

At least one aspect of the present invention provides a flexible LESD system comprising the light emitting semiconductor device of Embodiment A and the support article of Embodiment B or C wherein the conductive pads of the second conductive layer of the flexible light emitting semiconductor device are electrically and thermally connected to the conductive pads of the first conductive layer of the support article and the conductive feature of the second conductive layer of the light emitting semiconductor device is thermally connected to the conductive feature of the first conductive layer of the support article.

Embodiment K

At least one aspect of the present invention provides a flexible LESD system comprising the light emitting semiconductor device of Embodiment A and the support article of Embodiments D, E, F, or H wherein the conductive pads of the second conductive layer of the light emitting semiconductor device are one or both of electrically and thermally connected to the conductive pads of the first conductive layer of the support article.

Embodiment L

At least one aspect of the present invention provides a flexible LESD system comprising the light emitting semiconductor device of Embodiment A and the support article of Embodiment G wherein the conductive pads of the second conductive layer of the light emitting semiconductor device are one or both of electrically and thermally connected to the conductive material in the cavities, or vias, of the support article.

Embodiment M

At least one aspect of the present invention provides a system comprising the light emitting semiconductor device of Embodiment A and the support article of Embodiment I wherein the conductive pads of the second conductive layer of the light emitting semiconductor device are electrically and thermally connected to the conductive pads of the first conductive layer of the support article and the conductive feature of the second conductive layer of the light emitting semiconductor device is thermally connected to the conductive feature of the first conductive layer of the support article.

Embodiment N

At least one aspect of the present invention provides a light emitting semiconductor device comprising a flexible dielectric layer having a first major surface with a first conductive layer thereon and having a second major surface with a second conductive layer thereon, the dielectric layer having a cavity, or via, extending from the first major surface toward, or to, the second major surface of the dielectric layer, the first conductive layer extending into the cavity, or via; the cavity, or via, being optionally filled with additional conductive material; and a light emitting semiconductor in the cavity, or via.

Embodiment O

At least one aspect of the present invention provides a support article comprising a flexible dielectric layer having a first major surface with a first conductive layer thereon and having a second major surface with a second conductive layer thereon, the dielectric layer having at least one cavity, or via, extending from the first major surface toward, or to, the second major surface; the first conductive layer extending into the at least one cavity, or via; the at least one cavity, or via, optionally containing additional conductive material.

Embodiment P

At least one aspect of the present invention provides a flexible LESD system comprising the light emitting semiconductor device of Embodiment N and the support article of Embodiment O wherein the second conductive layer of the light emitting semiconductor device are one or both of electrically and thermally connected to the conductive material in the cavities, or vias, of the support article.

Embodiment Q

At least one aspect of the present invention provides a light emitting semiconductor device of Embodiment N further comprising protrusions extending from the second conductive layer.

Embodiment R

At least one aspect of the present invention provides a support article of Embodiment O further comprising indentation in conductive layer or conductive material in the cavity, or via.

Embodiment S

At least one aspect of the present invention provides a flexible LESD system comprising the light emitting semiconductor device of Embodiment Q and the support article of Embodiment R, wherein the protrusions extending from the second conductive layer of the light emitting semiconductor device fit into the indentation in the conductive layer or conductive material in the cavity, or via, of the support article.

As used in this application:

"LES" means light emitting semiconductor(s), including light emitting diodes and laser diodes;

"LESD" means light emitting semiconductor devices, including light emitting diode device(s) and laser diode device(s); an LESD may be a bare LES die construction, a complete packaged LES construction, or an intermediate LES construction comprising more than the bare die, but less than all the components for a complete LES package, such that the terms LES and LESD may be used interchangeably and refer to one or all of the different LES constructions; a "discrete LESD" typically refers to one or more LESDs that are "packaged" and ready to function once connected to an electrical source, such as driving circuits including MCPCBs, MISs, etc. Examples of discrete LESDs that may be suitable for use in embodiments of the present invention Golden DRAGON LEDs, available from OSRAM Opto Semiconductors GmbH, Germany; LUXEON LEDs, available from Philips Lumileds Lighting Company, USA; and XLAMP LEDs, available from Cree, Inc., USA, as well as the discrete LESDs described herein and similar devices.

"support article" means a circuitized flexible article to which one or more discrete LESDs are attached; commercially available alternatives to the support article of the present invention may include metal core printed circuit boards (MCPCBs), metal insulation substrates (MIS), Bergquist thermal boards, and COOLAM thermal substrates;

"flexible LESD" typically refers to a support article having one or more attached discrete LESD.

An advantage of at least one embodiment of the present invention is:

Using the support article of the present invention with a discrete LESD can reduce the overall thermal resistance of light emitting device.

Using the support article of the present invention with discrete LESDs can allow for quick and cost-effective repair in that, e.g., individual defective LESDs may be easily detached and removed from the vias or cavities and replaced with new LESDs.

The vias and cavities of the present invention containing conductive material provide excellent Z-axis thermal conductivity.

The size of the vias and cavities and the surface area of the conductive layers can be tailored to provide optimized thermal resistance values.

The vias and cavities can be designed to accommodate various LESD electrical contacts.

The use of a support article of the present invention with LESDs can eliminate the cost associated with conventional LED submounts.

The flexible LESDs of the present invention can provide a robust, cost-effective thermal management solution for current and future high power LESD constructions.

The above summary of the present invention is not intended to describe each disclosed embodiment or every implementation of the present invention. The Figures and detailed description that follow below more particularly exemplify illustrative embodiments.

DETAILED DESCRIPTION

Figure 1:
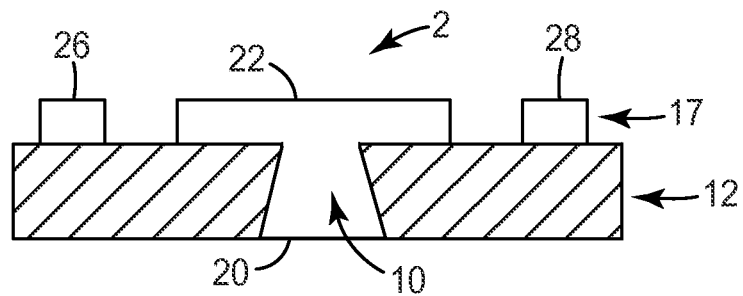
FIG. 1 depicts an embodiment of a support article of the present invention.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Unless otherwise indicated, the terms "coat," "coating," "coated," and the like are not limited to a particular type of application method such as spray coating, dip coating, flood coating, etc., and may refer to a material deposited by any method suitable for the material described, including deposition methods such vapor deposition methods, plating methods, coating methods, etc.

Exemplary embodiments of the present invention as described herein may pertain to a support article comprising vias, which extend all the way through the dielectric layer, thereby forming an opening through the dielectric layer. Alternatively, in some embodiments of the support articles of the present invention, the dielectric layer is not etched all the way through, so that a cavity, having one open end and one closed end, is formed. If this is done, the remaining dielectric material is preferably thin, e.g., up to about 20% to about 30% of the thickness of the dielectric layer. For a dielectric layer having a thickness of about 50 micrometers, a suitable thickness for the remaining dielectric layer is up to about 10 to 15 micrometers (about 20% to about 30% of the total dielectric thickness), in some embodiments, preferably about 1 to about 5 microns, so that it will not significantly inhibit heat transfer. It may be desirable to retain this thin layer of dielectric material, for example, to provide structural integrity, to manage CTE mismatches of adjacent material, or to provide an electrical barrier between electrically conductive feature or layers. Throughout this description, it is intended that all embodiments described with vias have equivalent embodiments with cavities, and vice versa, unless such an alternate embodiment would be physically impossible. When substituting a via for a cavity, or more particularly when substituting a cavity for a via, modifications to the embodiments may be required to establish suitable electrical connections and paths. In at least some embodiments of the present invention, the conductive material within a cavity or via may comprise in whole or in part a portion of a conductive layer that extends from a surface of the flexible dielectric layer into the cavity or via.

Although the embodiments herein typically describe a single LESD or a single site on a support article for attaching an LESD, it is to be understood that the invention covers multiple LESDs and support articles with multiple sites for attaching LESDs. Additionally, the embodiments herein may include additional cavities or vias throughout the dielectric layer, for example, adjacent to the attached LESDs, to provide additional heat dissipation features.

Any suitable dielectric layer material may be used to form an embodiment of the present invention having a cavity in place of a via. Suitable methods for forming cavities include essentially the same methods as for forming a via except that methods that cannot be controlled sufficiently to leave a remaining layer of unetched dielectric material are not suitable.

At least one embodiment of a support article 2 of the present invention is illustrated in FIG. 1, which shows a flexible dielectric layer 12 having at least one via 10 filled with conductive material 20, which may be copper or other conductive materials. Via 10 extends through dielectric layer 12 and may be any suitable shape, e.g., circular, oval, rectangular, serpentine, a channel, a grid (e.g., forming islands of dielectric layer separated by a continuous pattern of overlapping channels), etc. For example, if the via is channel-shaped or grid-shaped, a continuous path of conductive material 20 can be located within the outer confines of dielectric layer 12. The flexible dielectric layer 12 has first and second major surface. Top conductive layer 17 is disposed on the first major surface of dielectric layer 12 and may be patterned to include a conductive feature 22, which may be an electrically isolated conductive feature, on which feature LESD 24 is disposed. LESD 24 can be attached, directly, or indirectly, to conductive feature 22 using a known die bonding method such as eutectic, solder, adhesive, and fusion bonding. LESD 24 may be wire bonded through conductive pads 26 and 28 to electrically conductive circuits also patterned in top conductive layer 17. In at least some embodiments of the invention, conductive pads 26, 28 (as well as 426, 426', 428, and 428') are a particular type of conductive feature. They may be patterned features of top or bottom conductive layers 16 or 17 and may comprise Cu. Alternatively, they may comprise a different material such as Au, AuSn, AuGe, or other suitable materials. They typically provide at least an electrical connection and may optionally provide a thermal connection, as opposed to other conductive features, which might only provide a thermal connection in some embodiments. In some embodiments, a passivation or bonding layer is located beneath LESD 24 to facilitate bonding LESD 24 to an underlying layer. In at least one embodiment, thermally conductive layer 30 is attached to the support article adjacent the second major surface of dielectric layer 12, which brings it into contact with conductive material 20 in via 10. Thermally conductive layer 30 may be any material that is thermally conductive. For example, conductive substrate may be a thermal interface material (TIM), a metal strip, e.g., of copper or aluminum, a heat sink, or other heat transferring or heat absorbing material. Thermally conductive layer 30 may be attached to the support article using a thermally conductive adhesive. The juxtaposition of conductive feature 22, conductive material 20 in via 10, and thermally conductive layer 30 allows for efficient dissipation of heat generated by the LESD to thermally conductive layer 30. In addition, the conductive material in via 10 can provide mechanical support for conductive feature 22, which is essentially suspended over the opening of via 10. In an alternate embodiment of the present invention, instead of applying thermally conductive layer 30 to conductive material 20, an adhesive, e.g., a TIM with adhesive properties, on a liner can be applied to the conductive material 20, so that the support article can be directly applied, at a later time, to a conductive substrate or a heat sink.

Figure 2A:
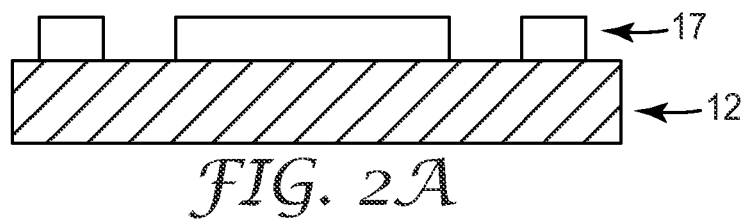
FIGS. 2A-2E depict a process for preparing a support article of the present invention.
Figure 2B:
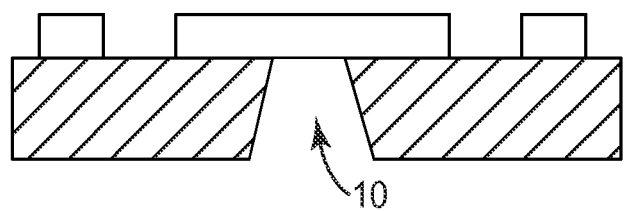
Figure 2C:
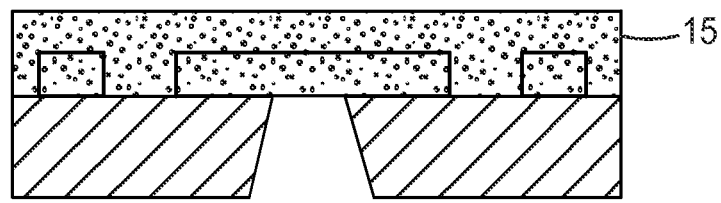
Figure 2D:
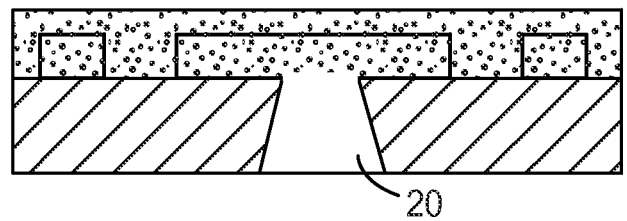
Figure 2E:
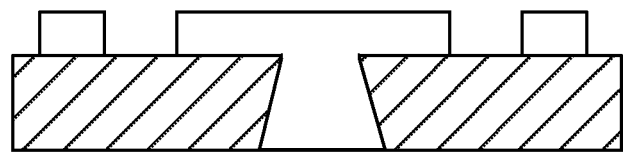

FIGS. 2A through 2E show a method of making the support article 2 illustrated in FIG. 1. Top conductive layer 17 is applied and patterned on a first side of flexible dielectric layer 12 (FIG. 2A), then via 10 is formed in flexible dielectric layer 12, extending from a second side to the first side of flexible dielectric layer 12 (FIG. 2B), a photoresist mask is applied over top conductive layer 17, except for the portion exposed by via 10 (FIG. 2C), via 10 is filled with conductive material 20, e.g., by electrodeposition such as electroplating by building up conductive material on the surface of the conductive layer facing the via (FIG. 2D), and the photoresist layer is removed (FIG. 2E).

Figure 3:
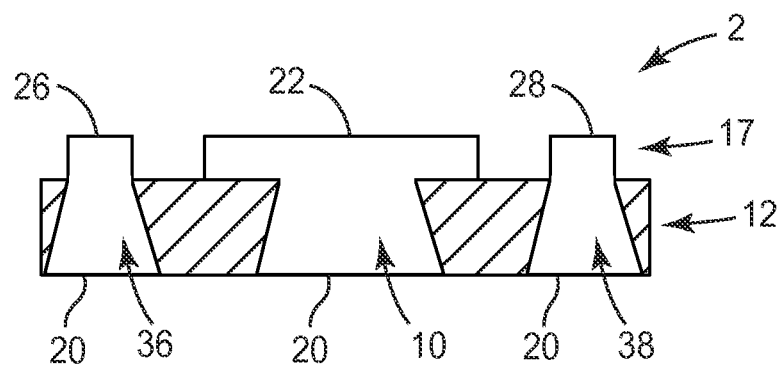
FIG. 3 depicts an embodiment of a support article of the present invention.

FIG. 3 is an alternate embodiment of the support article of FIG. 1. The support article 2 of FIG. 3 has two additional vias 36 and 38 extending through dielectric layer 12 beneath conductive pads 26 and 28 and are filled with conductive material 20, which may be copper or other conductive materials. These vias can acts as both electrodes and heat transfer channels. If the support article has cavities in place of vias 36 and 38, the cavities can act as heat transfer channels, but would not act as electrodes because they would be insulated from conductive pads 26 and 28 by a thin layer of dielectric material.

Figure 4:
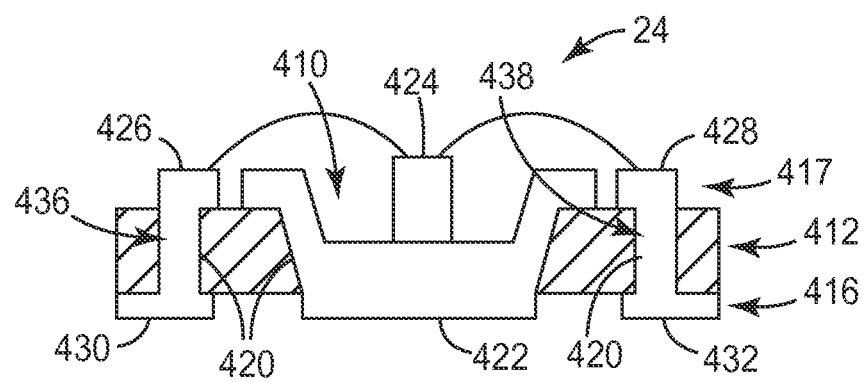
FIGS. 4 and 4' depict embodiments of LESDs of the present invention.
Figure 4:
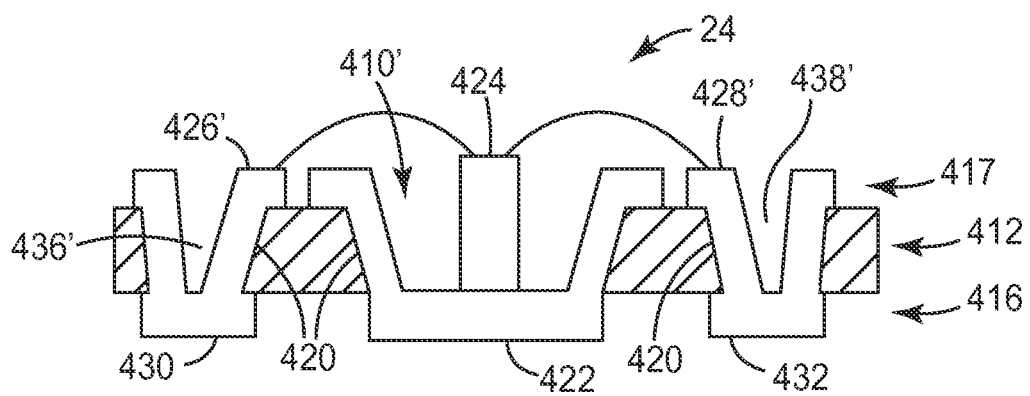

FIG. 4 illustrates an embodiment of an LESD 24 that may be used with the support article 2 of FIG. 1. LESD 24 has many of the same or similar components as support article 2. The flexible dielectric layer 412 has first and second major surface. Vias 410, 436, and 438 extend through dielectric layer 412 from the first to second surfaces and may be any suitable shape. Vias 410, 436, and 438 may be fully filled, as shown, or partially filled with conductive material 420, which may be copper or other suitable conductive materials. Top conductive layer 417 is disposed on the first major surface of dielectric layer 412 and bottom conductive layer 416 is disposed on the second major surface of flexible dielectric layer 412. Conductive layer 416 may be patterned to include a conductive feature 422, which may be an electrically isolated conductive feature, and conductive features 430 and 432, which may be electrically connected to conductive pads 426 and 428 through vias 436 and 438, respectively. LES 424 can be attached, directly, or indirectly (e.g., through conductive material 420), to conductive feature 422 using a known die bonding method such as eutectic, solder, adhesive, and fusion bonding. Top conductive layer 417 may include conductive pads 426 and 428. LES 424 may be wire bonded to conductive pads 426 and 428. Conductive pads 426, 428 may comprise Au, AuSn, AuGe, or other suitable materials. In some embodiments, a passivation or bonding layer is located beneath LES 424 to facilitate bonding LES 424 to an underlying layer.

FIG. 4' illustrates and LESD 24 similar to the LESD of FIG. 4 except for several modified features: Vias 436' and 438' have hollow plated vias, i.e., at least a portion of the via has plated walls but is not fully filled with conductive material. Via 410' has conductive material 420 on its walls, but none on conductive feature 422. This can be accomplished, for example, by creating conductive feature 422 after conductive material 420 is applied to the walls of via 410'. Conductive pads 426' and 428' are located at (or around) the top edge of vias 436' and 438'. LES 424 sits directly on conductive feature 422. Bottom conductive layer 416 is optionally thicker than top conductive layer 417.

Figure 5:
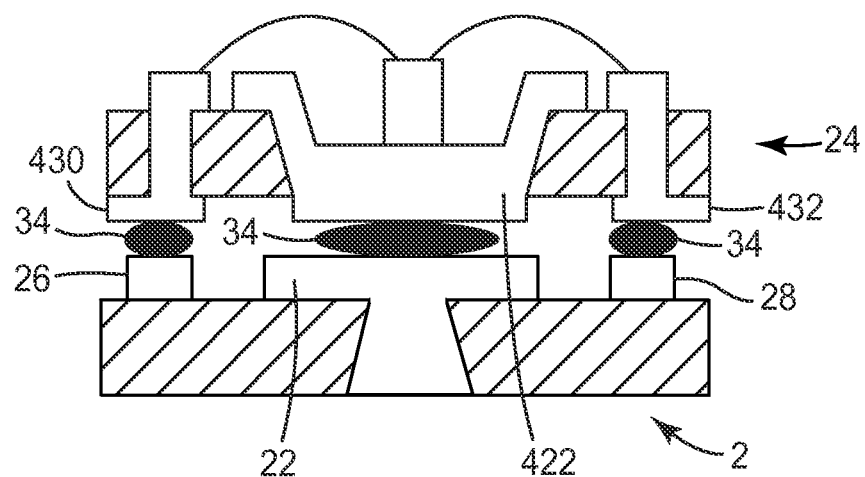
FIG. 5 depicts an embodiment of an LESD of the present invention attached to an embodiment of a support article of the present invention.

FIG. 5 illustrates the LESD 24 of FIG. 4 attached to the support article 2 of FIG. 1. In this embodiment, conductive features 430 and 432 are attached by solder 34 to conductive pads 26 and 28, respectively, to establish an electrical (and thermal) path and conductive feature 422 is attached by solder 34 to conductive feature 22 to establish a thermal path.

Figure 6:
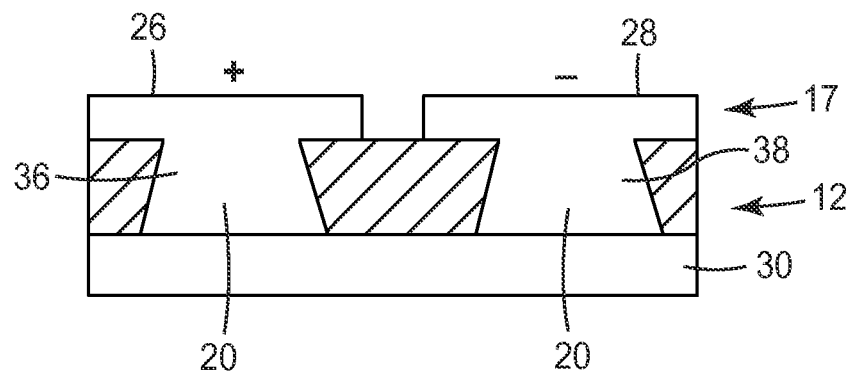
FIG. 6 depicts an embodiment of a support article of the present invention.

FIG. 6 illustrates an embodiment of support article 2 having a flexible dielectric layer 12 having two vias 36 and 38 extending therethrough beneath conductive pads 26 and 28, respectively, formed in top conductive layer 17. Vias 36 and 38 are filled with conductive material 20, which may be copper or other conductive materials. These vias can act as both electrodes and heat transfer channels. If the support article has cavities in place of vias 36 and 38, the cavities can act as heat transfer channels, but would not act as electrodes because they would be insulated from conductive pads 26 and 28 by a thin layer of dielectric material. An optional thermally conductive layer 30, which may comprise a thermal interface material (TIM) is shown in FIG. 6.

Figure 7:
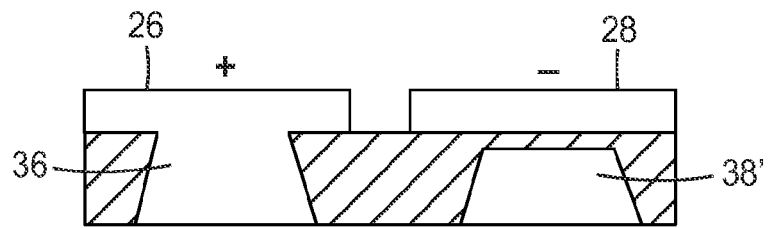
FIG. 7 depicts an embodiment of a support article of the present invention.

FIG. 7 illustrates an embodiment of support article 2 similar to that of FIG. 6 except that there is a via 36 extending through dielectric layer 12 under conductive pad 26 and a cavity 38' under conductive pad 28. In this configuration, via 36 would be electrically connected to conductive pad 26, cavity 38' would not be electrically connected to pad 28, but both would via 36 and cavity 38' would act as heat transfer channels.

Figure 8:
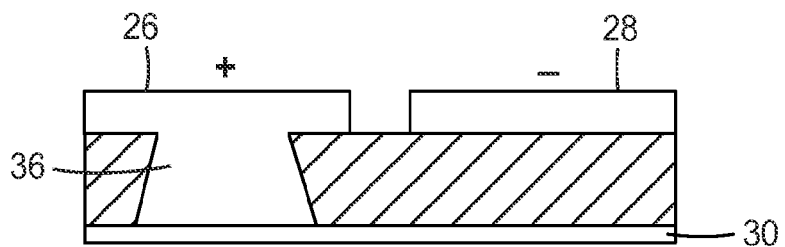
FIG. 8 depicts an embodiment of a support article of the present invention.

FIG. 8 illustrates an embodiment of support article 2 similar to that of FIGS. 6 and 7 except that there is only a via 36 extending through dielectric layer 12 under conductive pad 26. There is no via or cavity under conductive pad 28. An optional conductive substrate 30, e.g., a TIM layer, may be attached to the second surface of dielectric layer 12.

Figure 9A:
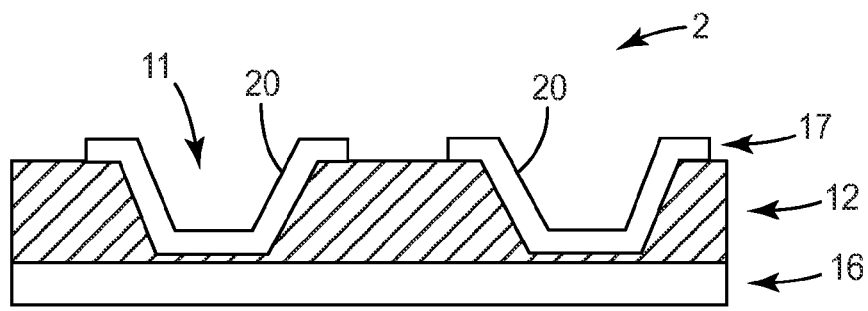
FIGS. 9A-9B depict embodiments of support articles of the present invention.
Figure 9B:
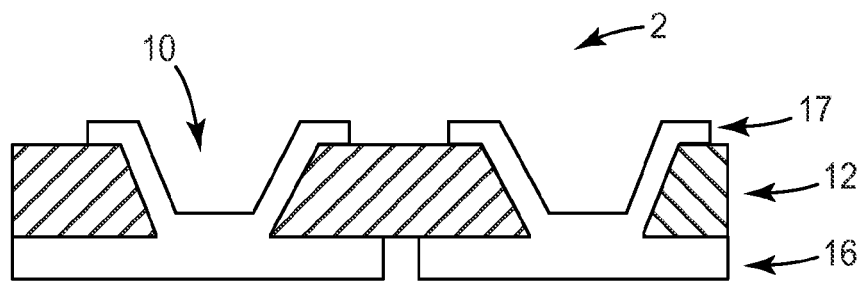
Figure 9C:
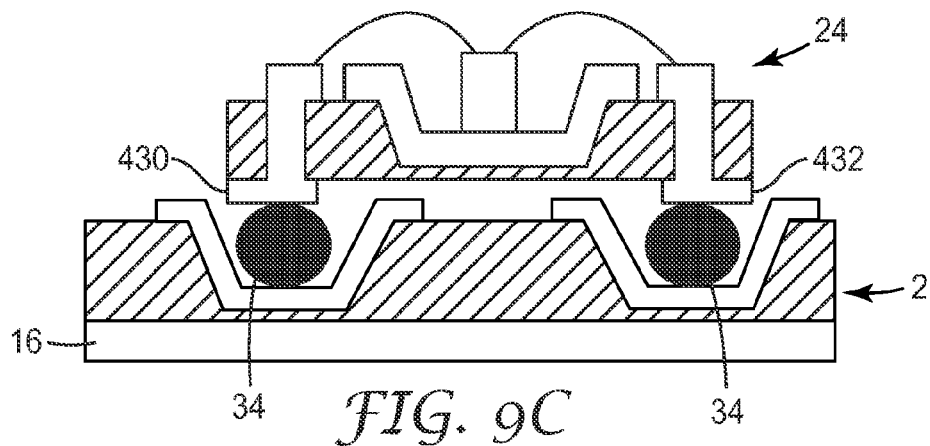
FIGS. 9C-9D depict embodiments of an LESD of the present invention attached to embodiments of support articles of the present invention.
Figure 9D:
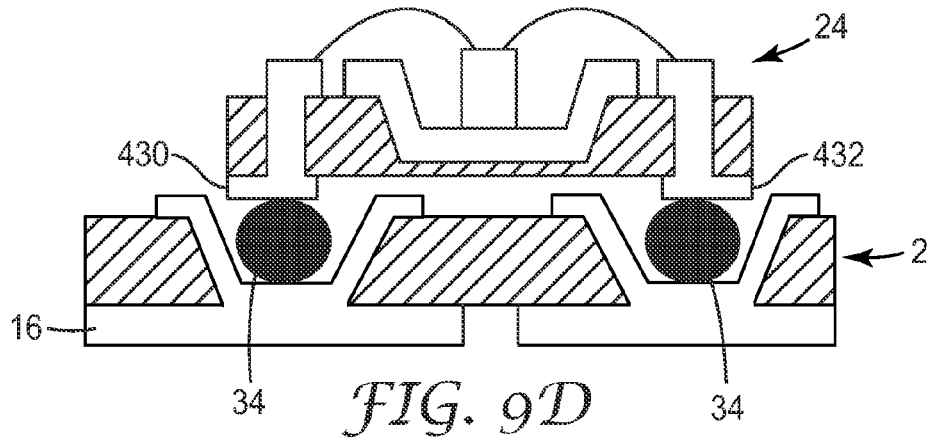
Figure 14:
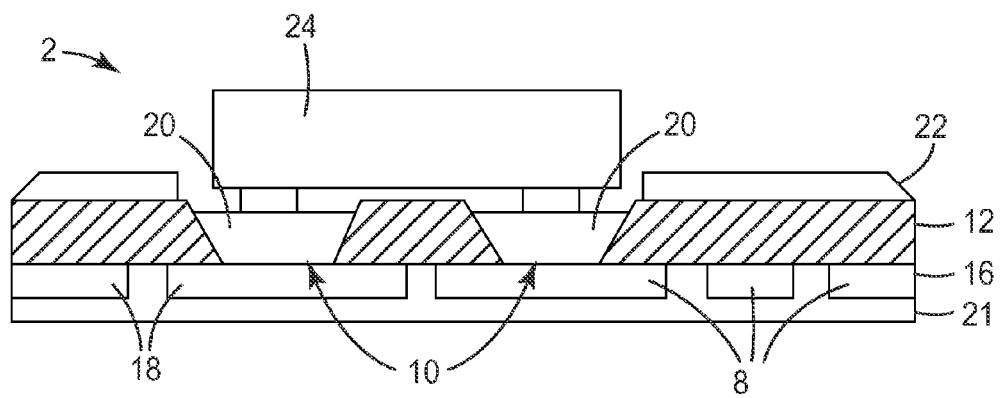
FIG. 14 depicts an embodiment of a support article of the present invention with an LESD attached.
Figure 15:
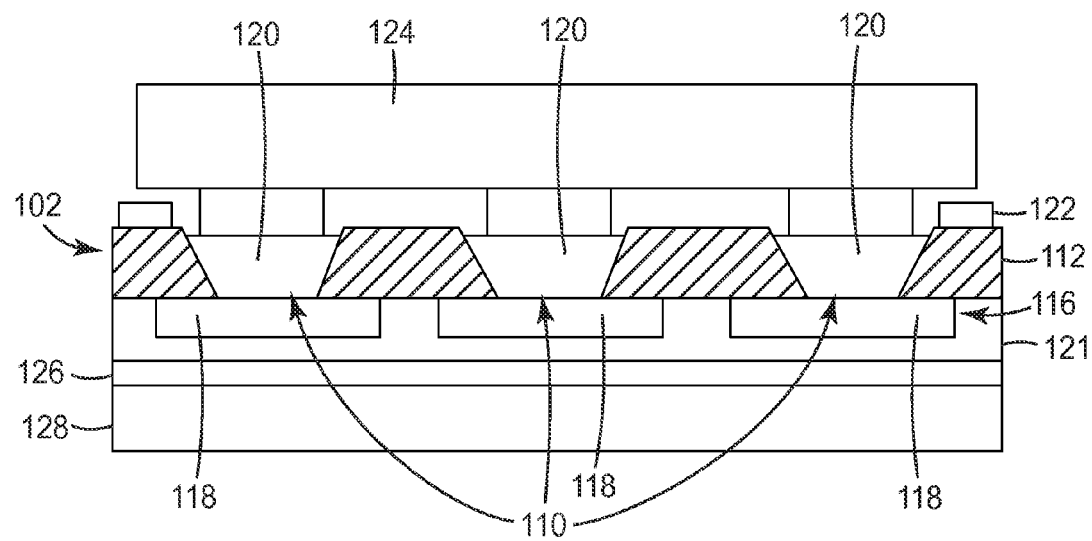
FIG. 15 depicts an embodiment of a support article of the present invention with an LESD attached.

FIGS. 9A and 9B illustrate embodiments of support article 2 in which the cavities 11 (FIG. 9A) or vias 10 (FIG. 9B) extend from the first side to the second side of dielectric layer 12. FIG. 9A includes bottom conductive layer 16 on the second surface of dielectric layer 12 and top conductive layer 17 on the first surface of dielectric layer 12. Top conductive layer 17 is patterned on the first surface of dielectric layer 12 and extends into cavities 11. Cavities 11 may contain additional conductive material (not shown). Bottom conductive layer 16 may be patterned or unpatterned and is electrically insulated from cavities 11. FIG. 9B includes bottom conductive layer 16 on the second surface of dielectric layer 12 and top conductive layer 17 on the first surface of dielectric layer 12. Top conductive layer 17 is patterned on the first surface of dielectric layer 12 and extends into vias 10. Vias 10 extend entirely through dielectric layer 12 and may contain additional conductive material (not shown). Bottom conductive layer 16 is patterned at least to electrically isolate the vias 10 from one another. FIGS. 9C and 9D illustrate the support articles 2 of FIGS. 9A and 9B, respectively, to which LESDs 24 have been attached by solder bonding conductive features 430 and 432 into cavities 11 or vias 10 using solder 34 (shown before reflow). An optional thermally conductive layer (not shown), e.g., a TIM layer, may be attached to bottom conductive layer 16. The embodiments illustrated in FIGS. 9C and 9D, in which solder 34 (not shown to scale) is placed in cavities 11 or vias 10 provide the additional advantage of a level solder pad. When the solder in the cavities 11 or vias 10 is reflowed, it is held in place by the walls of the cavities or vias and forms a level surface to which solder bonding features 430 and 432 may be attached (as illustrated in FIGS. 14 and 15).

Figure 10A:
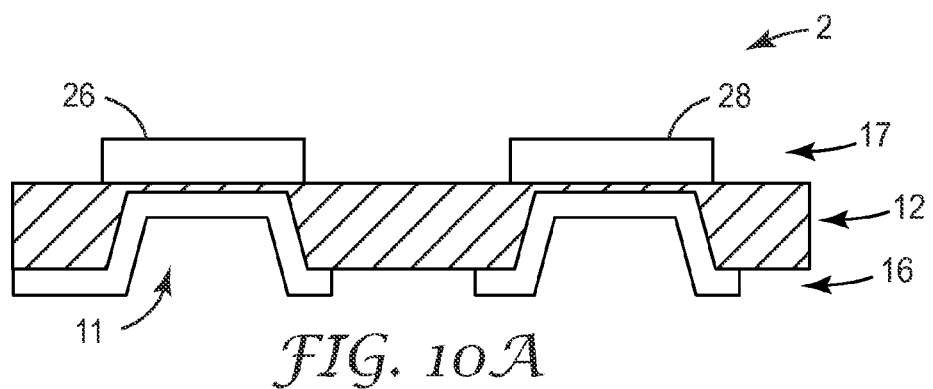
FIGS. 10A-10B depict embodiments of support articles of the present invention.
Figure 10B:
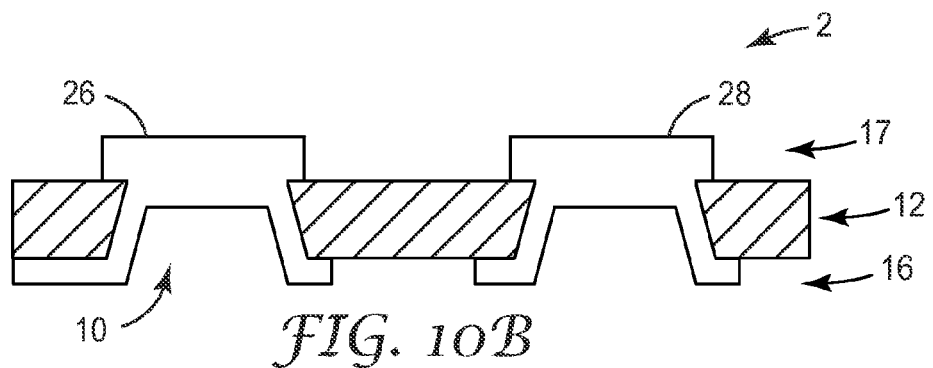
Figure 10C:
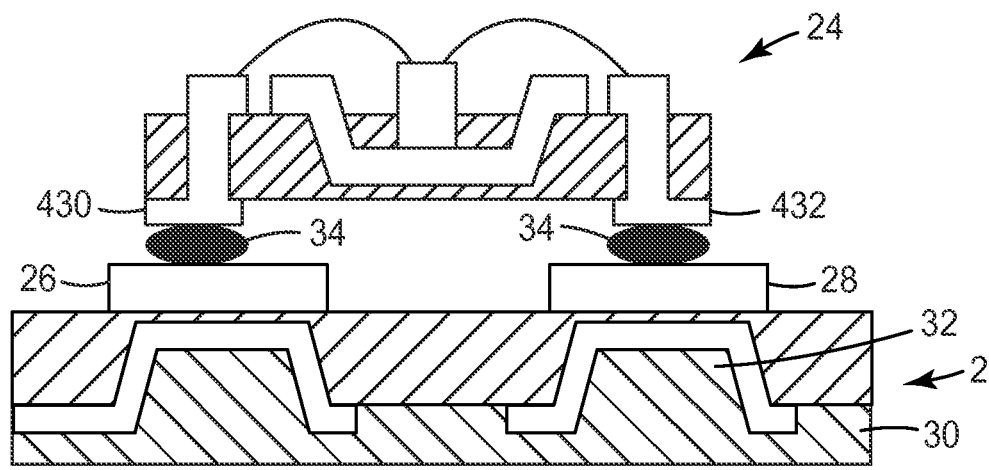
FIGS. 10C-10D depict embodiments of an LESD of the present invention attached to embodiments of support articles of the present invention.
Figure 10D:
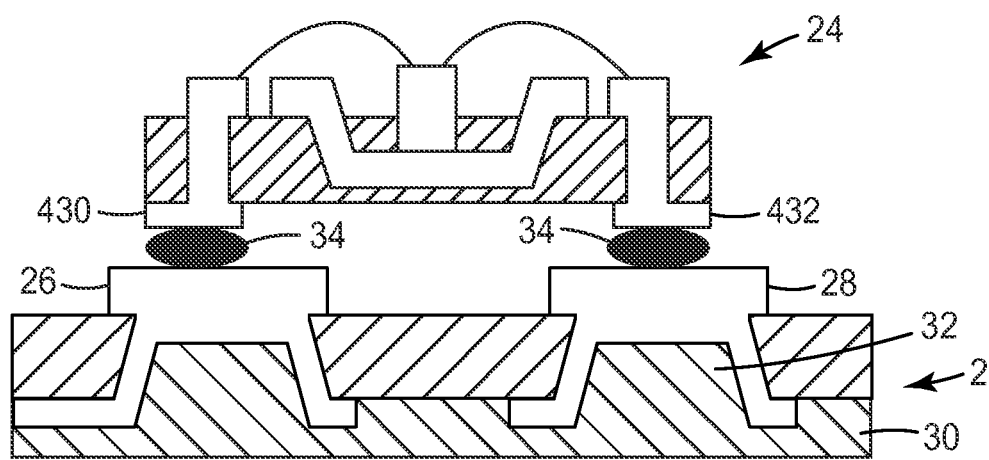

FIGS. 10A and 10B illustrate embodiments of support article 2 in which the cavities 11 (FIG. 10A) or vias 10 (FIG. 10B) extend from the second side to the first side of dielectric layer 12. FIG. 10A includes conductive layer 16 on the second surface of dielectric layer 12 and top conductive layer 17 on the first surface of dielectric layer 12. Bottom conductive layer 16 is patterned on the second surface of dielectric layer 12 and extends into cavities 11. Cavities 11 may contain additional conductive material (not shown). Top conductive layer 17 is patterned to form conductive pads 26 and 28 to which LESDs may be attached. These conductive pads are electrically insulated from cavities 11. FIG. 10B includes conductive layer 16 on the second surface of dielectric layer 12 and top conductive layer 17 on the first surface of dielectric layer 12. Conductive layer 16 is patterned on the second surface of dielectric layer 12 and extends into vias 10. Vias 10 extend entirely through dielectric layer 12 and may contain additional conductive material (not shown). Top conductive layer 17 is patterned to form conductive pads 26 and 28 to which LESDs may be attached. These conductive pads are electrically connected to vias 10. FIGS. 10C and 10D illustrate the support articles 2 of FIGS. 10A and 10B, respectively, to which LESDs 24 have been attached by solder bonding conductive features 430 and 432 to conductive pads 26 and 28 with solder 34. An optional thermally conductive layer 30, e.g., a TIM layer, may be attached to conductive layer 16 and conductive material 32, e.g., a TIM, may be placed into vias 10 and cavities 11 as illustrated in FIGS. 10C and 10D. As illustrated in FIGS. 10C and 10D, if conductive layer 30 comprises conformable material, it may flow into, or be pressed into, cavities 11 or vias 10 thereby allowing the application of conductive layer 30 and conductive material 32 in a single step. Alternatively, conductive material 32 may comprise a different (or the same) material than conductive layer 30 and may be applied in a different step.

Figure 11A:
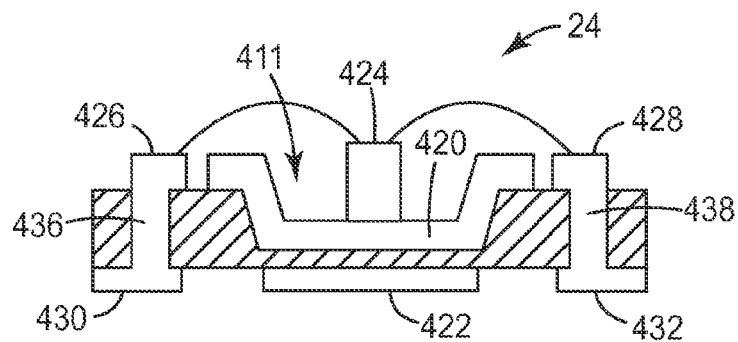
FIGS. 11A and 11A' depict embodiments of LESDs of the present invention
Figure 11A:
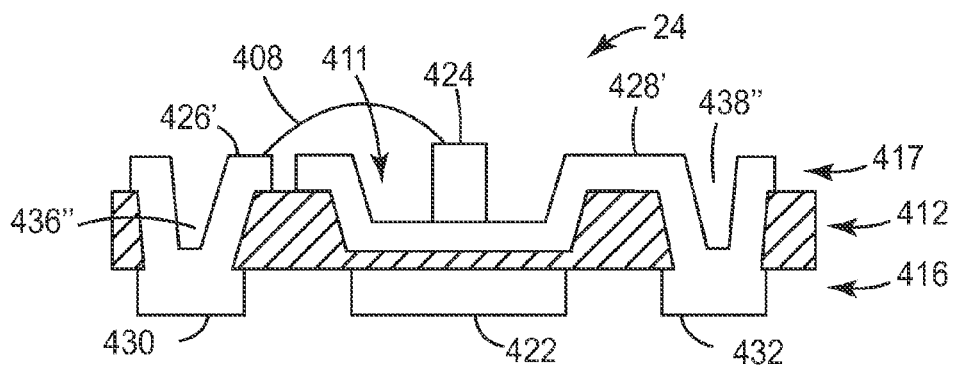
Figure 11B:
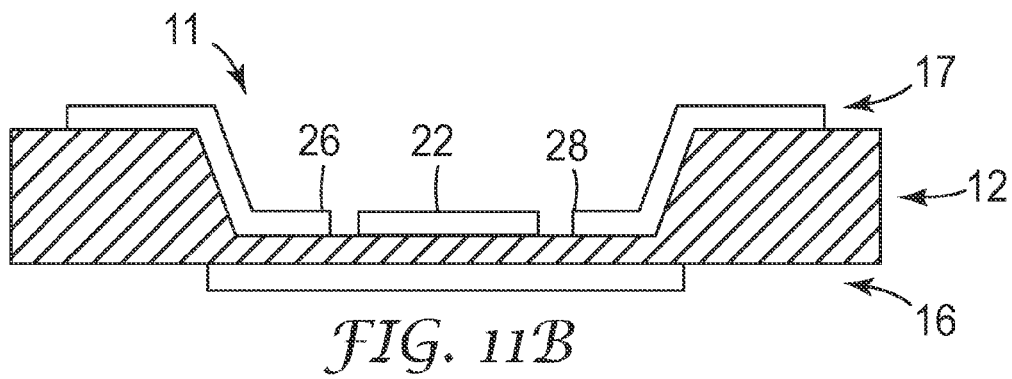
FIG. 11B depicts an embodiment of a support article of the present invention.
Figure 11C:
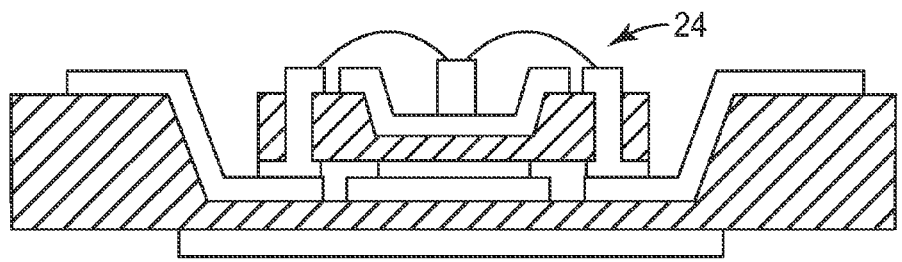
FIG. 11C depicts an embodiment of an LESD of the present invention attached to an embodiment of a support article of the present invention.

FIG. 11A illustrates an embodiment of an LESD of the present invention similar to the LESD of FIG. 4 except that the LESD 24 of FIG. 11A has a cavity 411 instead of a via. FIG. 11A' illustrates an embodiment of an LESD 24 of the present invention similar to the LESD of FIG. 11A with some exceptions. In FIG. 11A', LES 424 has both a top and bottom contact such that only one wire bond is required. Wire bond 408 connects the top contact of LES 424 to conductive pad 426', which is electrically connected to solder bonding features 430 through via 436". The bottom contact of LES 424 is connected to conductive pad 428' through top conductive layer 417 including the portion of top conductive layer 417 extending into cavity 411. Conductive pad 428' is electrically connected to solder bonding feature 432 through via 438". Vias 436" and 438" comprise in part hollow plated vias, i.e., at least a portion of the via has plated walls but is not fully filled with conductive material. However, in contrast to the hollow plated vias 436' and 438' of FIG. 4', vias 436" and 438" have conductive material filling the bottom portion of the via. This can be accomplished, for example, by applying bottom conductive layer 416 prior to depositing conductive material in the vias. Conductive pads 426' and 428' are located at (or around) the top edge of vias 436' and 438'. Bottom conductive layer 416 is optionally thicker than top conductive layer 417. FIG. 11B illustrates an embodiment of support article 2 in which cavity 11 extends from the first to the second surface of dielectric layer 12, conductive feature 22 is located within cavity 11 and conductive pads 26 and 28 are patterned to extend into cavity 11. Bottom conductive layer 16 may optionally be on the second surface of dielectric layer 12 and an optional thermally conductive layer 30, e.g., a layer of TIM (not shown), may optionally be applied to conductive layer 16 and/or the second surface of dielectric layer 12. FIG. 11C illustrates the support article of FIG. 11B with LESD 24 of FIG. 11A attached to conductive pads 26 and 28 and conductive feature 22 within cavity 11. In this embodiment, the height of LESD 24 above the height of the support article 2 can be minimized to keep the overall height of the article low.

Figure 12A:
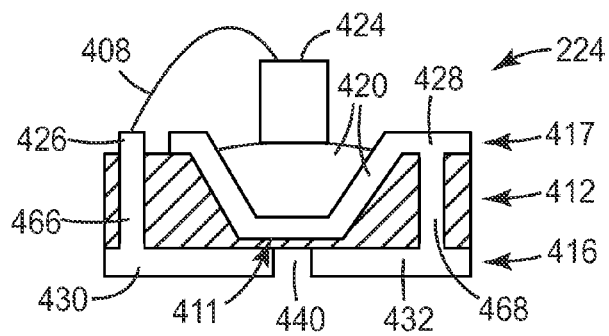
FIGS. 12A and 12A' depict embodiments of LESDs of the present invention.
Figure 12A:
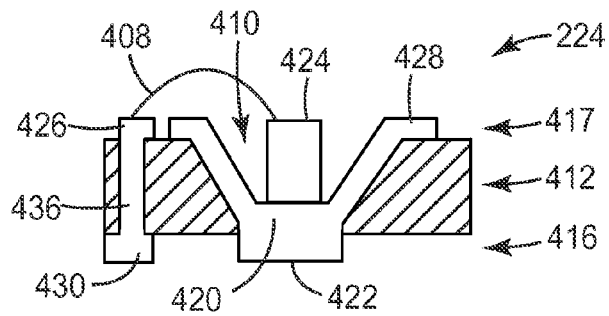
Figure 12B:
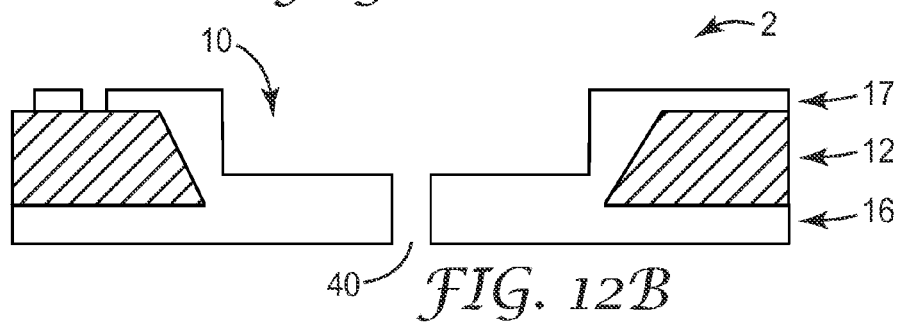
FIG. 12B depicts an embodiment of a support article of the present invention.
Figure 12C:
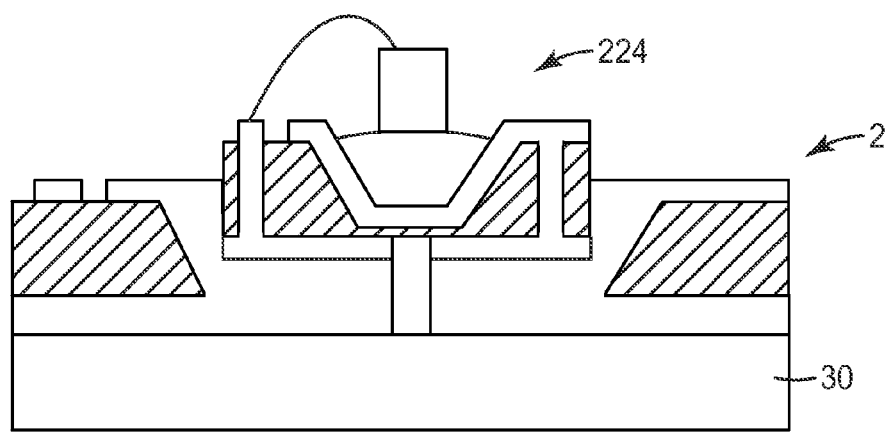
FIG. 12C depicts an embodiment of an LESD of the present invention attached to an embodiment of a support article of the present invention.

FIG. 12A illustrates an LESD 224 that may be placed in via 10 of support article 2 of FIG. 12B. LESD 224 includes cavity 411 that extends from the first to the second surface of dielectric layer 412. Top conductive layer 417 is patterned on the first surface of dielectric layer 412 and extends into cavity 411. Bottom conductive layer 416 may optionally be on the second surface of dielectric layer 412. LES 424 has both a top and bottom contact such that only one wire bond is required. Wire bond 408 connects the top contact of LES 424 to conductive pad 426, which is electrically connected to solder bonding features 430 through via 466. The bottom contact of LES 424 is connected to conductive pad 428 through conductive material 420 (e.g., solder or copper) and the portion of top conductive layer 417 extending into cavity 411. Conductive pad 428 is electrically connected to solder bonding feature 432 through via 468. A gap 440 separated solder bonding features 430 and 432. FIG. 12A' illustrates an LESD 224 similar to that of the LESD of FIG. 12A. The LESD of FIG. 12A' differs from that of FIG. 12A in that it comprises via 410 instead of cavity 411 and there is no via 468 and no solder bonding pad 432. Instead, the bottom contact of LES 424 is electrically connected to conductive feature 422 (which serves the purpose of missing solder bonding feature 432 in this embodiment) directly through the conductive material 420 (and the portion of top conductive layer 417 extending into via 410) located in via 410. FIG. 12B illustrates an embodiment of support article 2 in which via 10 extends from the first to the second surface of dielectric layer 12. Top conductive layer 17 is patterned on the first surface of dielectric layer 12 and extends into via 10. Bottom conductive layer 16 may optionally be on the second surface of dielectric layer 12 and a thermally conductive layer (not shown), e.g., a layer of TIM, may optionally be applied to bottom conductive layer 16 and/or the second surface of dielectric layer 12. A physical gap 40 is formed in bottom conductive layer 16 and the conductive material in via 10 so that the bottom contacts of an LES placed in via 10 will be electrically separated. FIG. 12C illustrates LESD 224 of FIG. 12A in via 10 of the support article of FIG. 12B. Gaps 1240 and 40 align. In this embodiment, the height of LESD 224 above the height of the support article 2 can be minimized to keep the overall height of the article low. Optional thermally conductive layer 30 is shown.

Figure 13A:
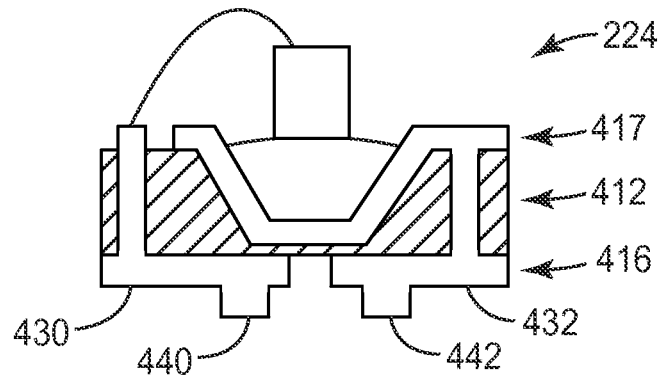
FIG. 13A depicts an embodiment of a support article of the present invention.
Figure 13B:
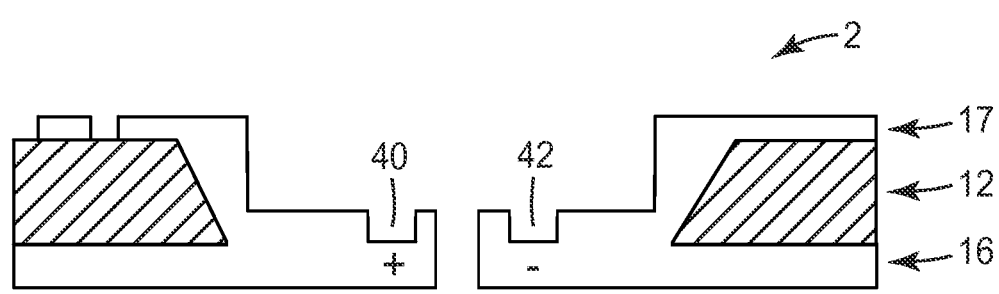
FIG. 13B depicts an embodiment of an LESD of the present invention.
Figure 13C:
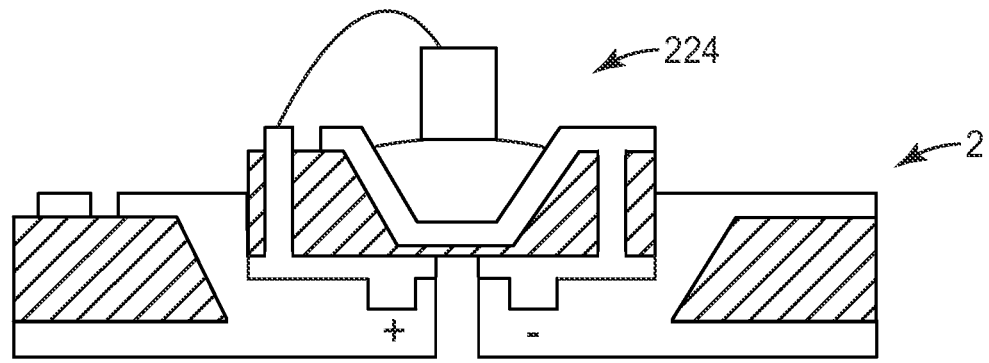
FIG. 13C depicts an embodiment of an LESD of the present invention attached to an embodiment of a support article of the present invention.

FIG. 13A illustrates a modified embodiment of the LESD 224 of FIG. 12A having protrusions 440, 442 extending from solder bonding features 430, 432 of bottom conductive layer 216, respectively. FIG. 13B illustrates a modified embodiment of the support article 2 of FIG. 12B in which via 10 includes notches 40, 42 for making electrical and mechanical contact with mating protrusions 440, 442 of LESD 224. FIG. 13C illustrates LESD 224 of FIG. 13A in via 10 of the support article 2 of FIG. 13B.

Although the embodiments of FIGS. 11C, 12C, and 13C show a single LESD in the cavity or via of the support article, the vias or cavities may be made to hold multiple LESDs.

FIG. 14 illustrates an embodiment of support article 2 in which two vias 10 extend from the top surface to the bottom surface of dielectric layer 12. Bottom conductive layer 16 is on the bottom surface of dielectric layer 12 and there is no conductive layer on the top surface of dielectric layer 12. Conductive layer 16 is patterned on the bottom surface of dielectric layer 12 and includes conductive features 18, electrically isolated from each other and two of which are located beneath vias 10. Vias 10 contain conductive material 20, which may be, for example, solder. A flip chip LESD 24 is attached to support article 2 by the conductive material 20 in vias 10. In the illustrated embodiment, a solder mask 21 is applied over conductive layer 16. A reflective solder mask 22 may optionally be applied to the first surface of support article 2, including under LESD 24 (not shown). The embodiment of FIG. 14 illustrates that if conductive material 20 in vias 10 comprises solder paste or other conductive material that can be reflowed, it provides the additional advantage of a level solder pad. When solder in the vias 10 is reflowed, it is held in place by the walls of the vias and forms a level surface to which flip chip LESD 24 may be attached. The two vias 10 act as anode and cathode electrodes for the flip chip LESD 24. An optional thermally conductive layer, which may comprise a TIM, may be attached to conductive layer 16 instead of, or in addition to, the solder mask. The thermally conductive layer may be used to attach the support article 2 to a substrate such as a flexible metal foil, a rigid metal layer, or a heat sink. These substrates may be made from any suitable material, but are typically copper or aluminum.

FIG. 15 illustrates an embodiment of support article 102 in which three vias 110 extend from the top surface to the bottom surface of dielectric layer 112. Conductive layer 116 is on the bottom surface of dielectric layer 112 and there is no conductive layer on the top surface of dielectric layer 112. Conductive layer 116 is patterned on the bottom surface of dielectric layer 112 and includes conductive features 118, electrically isolated from each other and three of which are located beneath vias 110. Vias 110 contain conductive material 120, which may be, for example, solder. A flip chip LESD 124 is attached to support article 102 by the conductive material 120 in vias 110. In the illustrated embodiment, a solder mask 121 is applied over conductive layer 116. A reflective solder mask 122 may optionally be applied to the first surface of support article 102, including under LESD 24 (not shown). In the same manner as the embodiment illustrated in FIG. 14, if conductive material 120 comprises solder paste or other conductive material that can be reflowed, it provides the additional advantage of a level solder pad. When the solder in the vias 100 is reflowed, it is held in place by the walls of the vias and forms a level surface to which flip chip LESD 124 may be attached. In at least one embodiment of the present invention, the outer vias 110 act as anode and cathode electrodes and the inner via 110 acts as a thermal via to improve heat transfer away from the flip chip LESD 124 through its center contact pad. An optional thermally conductive layer 126, which may comprise a TIM layer, is attached to solder mask 121. The thermally conductive layer 126 may be used to attach the support article 2 to a substrate 128 such as a flexible metal foil, a rigid metal layer, or a heat sink. These substrates may be made from any suitable material, but are typically copper or aluminum.

Each via 10 and 110 of support articles 2 and 102 of FIGS. 14 and 15 connects with one contact of an LESD 24 or 124 having to two or more contacts. In some embodiments in which the LESD has, e.g., two contacts having the same polarity or two contacts wherein one contact is electrically neutral, a single via might connect with the two contact, but a second adjacent via will connect to the contact of the LESD having a polarity opposite to the polarity of a contact connected with the first via.

Suitable dielectric layers for the present invention include polyesters, polycarbonates, liquid crystal polymers, and polyimides. Polyimides are preferred. Suitable polyimides include those available under the trade names KAPTON, available from DuPont; APICAL, available from Kaneka Texas corporation; SKC Kolon PI, available from SKC Kolon PI Inc.; and UPILEX and UPISEL, available from Ube-Nitto Kasei Industries, Japan. Most preferred are polyimides available under the trade designations UPILEX S, UPILEX SN, and UPISEL VT, all available from Ube-Nitto Kasei Industries. These polyimides are made from monomers such as biphenyl tetracarboxylic dianhydride (BBDA) and phenyl diamine (PDA). In at least one embodiment, the thickness of the dielectric layer is preferably 50 micrometers or less, but may be any thickness suitable for a particular application.

The dielectric layers may alternatively be materials such as FR4, depending on the application.

The dielectric layers (substrates) may be initially clad on one or both sides with a conductive layer. If the conductive layer(s) are to be formed into circuits, they may be pre-patterned, or may be patterned during the process of making the support articles. A multilayer flexible substrate (having multiple layers of dielectric and conductive material) may also be used as a substrate. The conductive layers may be any suitable material including copper, gold, nickel/gold, silver, and stainless steel, but are typically copper. The conductive layer may be applied in any suitable manner such as sputtering, plating, chemical vapor deposition, or it may be laminated to the dielectric layer or attached with an adhesive.

Vias or cavities may be formed in the dielectric layers using any suitable method such as chemical etching, plasma etching, focused ion-beam etching, laser ablation, embossing, microreplication, injection molding, and punching. Chemical etching may be preferred in some embodiments. Any suitable etchant may be used and may vary depending on the dielectric layer material. Suitable etchants may include alkali metal salts, e.g. potassium hydroxide; alkali metal salts with one or both of solubilizers, e.g., amines, and alcohols, such as ethylene glycol. Suitable chemical etchants for some embodiments of the present invention include KOH/ethanol amine/ethylene glycol etchants such as those described in more detail in U.S. Patent Publication No. 2007-0120089-A1, incorporated herein by reference. Other suitable chemical etchants for some embodiments of the present invention include a KOH/glycine etchants such as those described in more detail in co-pending U.S. Provisional Patent Application No. 61/409,791, incorporated herein by reference. Subsequent to etching, the dielectric layers may be treated with an alkaline KOH/potassium permanganate (PPM) solution, e.g., a solution of about 0.7 to about 1.0 wt % KOH and about 3 wt % KMnO4.

The side wall angles resulting from chemical etching varies, and is most dependent on etch rate, with slower etching rates resulting in shallower side wall angles. Typical side wall angles resulting from chemical etching are about 5° to about 60°, and in at least one embodiment, about 25° to about 28°. For purposes of this application, a sloped side wall means a side wall that is not perpendicular to the horizontal plane of the dielectric layer. Vias or cavities with sloped sidewalls could also be made using methods such as embossing, microreplication, and injection molding. Vias or cavities having sloped sidewalls may also be made with methods such as punching, plasma etching, focused ion-beam etching, and laser ablation; however, with these methods, the side walls typically have a steeper angle, e.g., up to 90°.

Embodiments of the present invention having vias or cavities with sloped side walls may be preferred because, e.g., for a given thickness of dielectric layer and a given via or cavity diameter nearest a conductive feature, a via having sloped side walls can contain more conductive material that a via having 90° side walls. For example, the opening of a via adjacent a conductive feature typically will be limited by the size of that conductive feature; however, by employing sloped via side walls, the opening at the opposing end of the via may be enlarged to an optimum size such that the via can contain a larger amount of conductive material (to transfer more heat away from the LESD) and the conductive at this opening has a large surface area that can interface more effectively with a heat transferring or absorbing material, such as a thermal interface material (TIM) or a metal substrate, which may be attached to the dielectric layer and conductive-filled vias.

If the vias in embodiments of the present invention have a conductive layer adjacent one opening, it can be filled with conductive material by electrodeposition, such as electroplating, by building up conductive material on the surface of the conductive layer facing the via.

Any suitable TIM may be used in embodiments of the present invention. Depending on the embodiment, the TIM may be applied to the support article as a liquid, paste, gel, solid, etc. Suitable methods for applying TIM depend on the properties of the specific TIM, but include precision coating, dispensing, screen printing, lamination etc.

Suitable methods for curing a curable TIM include UV curing, thermal curing etc.

The TIM may be coated on, e.g., as a liquid or a semi-solid such as a gel or paste, or may be laminated on in sheet form. A combination of TIMs could be used. For example, in some embodiments, such as those shown in FIGS. 10C and 10D, a first type of TIM may be applied in the vias or cavities and a second type of TIM may be applied to the second major surface of the dielectric layer, which would bring it into contact with the first type of TIM. In some embodiments, the TIM may also be adhesive-based. In such an embodiment, the TIM could adhere directly to the support article on one side and a conductive substrate on the other. A TIM that does not have adhesive properties could be applied to one or both of the substrate article and the conductive substrate with a thermally conductive adhesive. The TIM may be first applied to the substrate article and a conductive substrate applied to the TIM thereafter, or the TIM may be first applied to a conductive substrate and the TIM-coated conductive substrate applied to the substrate article thereafter.

The discrete LESDs can be made in a batch process or a continuous process such as a roll-to-roll process that is often used in making flexible circuits. Arrays of LESDs can be formed in any desired pattern on the flexible substrate. The LESDs can then be divided as desired, e.g., singulated into individual LESDs, strips of LESDs, or arrays of LESDs, e.g., by stamping or by slitting the substrate. Accordingly, an entire reel of LESDs on a flexible substrate can be shipped without the need for the traditional tape and reel process in which individual LESDs are typically transported in individual pockets of a carrier tape.

The support articles can also be made in a batch process or a continuous process such as a roll-to-roll process that is often used in making flexible circuits. The support articles can be formed with any desired pattern of LESD attachment sites on the flexible substrate. The support articles can then be divided as desired, e.g., singulated to provide individual LESD attachment sites, strips of LESD attachment sites, or arrays of LESD attachment sites, e.g., by stamping or by slitting the substrate.

Before or after forming support articles with individual, strips, or arrays of LESD attachment sites, the support articles can be attached to an additional substrate, for example with a thermally conductive adhesive. The thermally conductive adhesive can further facilitate the transfer of heat away from the LESDs, once attached to the support article. The support articles can be attached to any desired substrate, depending on their intended use. The additional substrate may be thermally and/or electrically conductive or may be a semiconductor, ceramic, or polymeric substrate, which may or may not be thermally conductive. For example, the additional substrates can be flexible or rigid metal substrates, such as copper or aluminum, heat sinks, dielectric substrates, circuit boards, etc.

If the flexible LESDs (comprising both the support article and discrete LESDs) are for use as a lighting strip, they could be enclosed in a waterproof/weatherproof, transparent casing, as described above.

If the flexible LESDs are in strip or array form, the discrete LESDs may be electrically connected to one or more of the other discrete LESDs in the strip or array. Additional elements such as Zener diodes and Schottky diodes can also be added to the top or bottom surface of the support article, e.g. using direct wafer bonding or flip chip processes. These elements may also be electrically connected to the LESDs.

In at least one embodiment of the present invention, the flexible LESs are thinner than conventional single or multiple LESD submounts because the LESD sits in a cavity or via in the support article. This enables the flexible LESDs of the present invention to be used in applications with tight volume restrictions, such as cell phones and camera flashes. For example, the support articles of the present invention can provide a package profile of approximately 0.7 to 4 mm, and in some embodiments 0.5 to 2 mm whereas conventional LESD submount profiles are typically greater than 4 mm and are approximately 4.8 mm to 6.00 mm. Moreover, the support articles of the present invention can be flexed or bent to easily fit into a non-linear or non-planar assembly if desired.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. This application is intended to cover any adaptations or variations of the preferred embodiments discussed herein. Therefore, it is manifestly intended that this invention be limited only by the claims and the equivalents thereof.

What is claimed is:

1. A flexible LESD system comprising:
a light emitting semiconductor device comprising:
a flexible dielectric layer having a first major surface with a first conductive layer thereon and having a second major surface with a second conductive layer thereon, the dielectric layer having one or both of a first and second via extending through the dielectric layer and a cavity or a third via extending from the first surface to, or toward, the second surface of the dielectric layer, the first conductive layer comprising conductive features in electrical contact with one or both of the first and second vias, the cavity or third via at least partially filled with conductive material, the second conductive layer comprising conductive features in electrical contact with one or both of the first and second vias; the cavity, or third via, being configured to receive a light emitting semiconductor; and
a support article comprising:
a flexible dielectric layer having a first major surface and having a second major surface with a conductive layer thereon, the dielectric layer having at least two adjacent cavities or vias extending from the first major surface toward, or to, the second major surface, the two or more cavities or vias each configured to receive one or more bottom contacts of an LES package mounted on the support article, wherein contacts received by a single cavity or via have the same, or a neutral, polarity,
wherein the conductive features of the second conductive layer of the light emitting semiconductor device make one or both of electrical and thermal connections in the cavities or vias of the support article.

2. A flexible LESD system comprising:
a light emitting semiconductor device comprising:
a flexible dielectric layer having a first major surface with a first conductive layer thereon and having a second major surface with a second conductive layer thereon, the dielectric layer having one or both of a first and second via extending through the dielectric layer and a cavity or a third via extending from the first surface to, or toward, the second surface of the dielectric layer, the first conductive layer comprising conductive features in electrical contact with one or both of the first and second vias, the cavity or third via at least partially filled with conductive material, the second conductive layer comprising conductive features in electrical contact with one or both of the first and second vias; the cavity, or third via, being configured to receive a light emitting semiconductor; and
a support article comprising a flexible dielectric layer having a first major surface with a first conductive layer thereon and having a second major surface, the dielectric layer having at least one cavity, or via, extending from the second major surface toward, or to, the first major surface, the at least one cavity, or via, containing conductive material, the first conductive layer comprising a first conductive feature disposed atop the cavity, or via, and at least one second conductive feature disposed adjacent the first conductive feature.

3. The flexible LESD system of claim 2 wherein a cavity, or via, containing conductive material is disposed under the at least one second conductive feature of the support article.

4. The flexible LESD system of claim 2 wherein the second major surface of the flexible dielectric layer of the support article has a second conductive layer thereon.

5. A flexible LESD system comprising:
a light emitting semiconductor device comprising:
a flexible dielectric layer having a first major surface with a first conductive layer thereon and having a second major surface with a second conductive layer thereon, the dielectric layer having one or both of a first and second via extending through the dielectric layer and a cavity or a third via extending from the first surface to, or toward, the second surface of the dielectric layer, the first conductive layer comprising conductive features in electrical contact with one or both of the first and second vias, the cavity or third via at least partially filled with conductive material, the second conductive layer comprising conductive features in electrical contact with one or both of the first and second vias; the cavity, or third via, being configured to receive a light emitting semiconductor, wherein the conductive features of the second layer extend under at least a portion of the third via or cavity and are electrically isolated from each other; and a support article comprising a flexible dielectric layer having a first major surface with a first conductive layer thereon and having a second major surface with a second conductive layer thereon, the dielectric layer having at least one cavity or via extending from the first major surface toward, or to, the second major surface and containing conductive material that form at least two electrically isolated conductive features.

6. The flexible LESD system of claim 5 wherein one or both conductive features of the light emitting semiconductor device comprises a protrusion and wherein at least one of the electrically isolated features comprises an indentation configured to receive the protrusion of the light emitting semiconductor device.

* * * * *